US011756923B2

(12) United States Patent
Broll et al.

(10) Patent No.: US 11,756,923 B2
(45) Date of Patent: Sep. 12, 2023

(54) HIGH DENSITY AND DURABLE SEMICONDUCTOR DEVICE INTERCONNECT

(71) Applicant: Infineon Technologies AG, Neubiberg (DE)

(72) Inventors: Marian Sebastian Broll, Soest (DE); Barbara Eichinger, Villach (AT); Alexander Herbrandt, Soest (DE); Alparslan Takkac, Meschede (DE)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 17/464,113

(22) Filed: Sep. 1, 2021

(65) Prior Publication Data

US 2023/0063259 A1 Mar. 2, 2023

(51) Int. Cl.
| H01L 21/56 | (2006.01) |
|---|---|
| H01L 23/31 | (2006.01) |
| H01L 23/00 | (2006.01) |

(52) U.S. Cl.
CPC .............. *H01L 24/84* (2013.01); *H01L 24/05* (2013.01); *H01L 24/40* (2013.01); *H01L 2224/05647* (2013.01); *H01L 2224/05684* (2013.01); *H01L 2224/05766* (2013.01); *H01L 2224/05787* (2013.01); *H01L 2224/40245* (2013.01); *H01L 2224/84214* (2013.01); *H01L 2224/84238* (2013.01); *H01L 2224/84379* (2013.01)

(58) Field of Classification Search
CPC ............................................. H01L 2224/40245
See application file for complete search history.

(56) References Cited

U.S. PATENT DOCUMENTS

| 2009/0261472 | A1 | 10/2009 | Bayerer | |
|---|---|---|---|---|
| 2013/0049204 | A1* | 2/2013 | Oeschler | H01L 24/32 |
| | | | | 257/772 |
| 2015/0179539 | A1* | 6/2015 | Tamai | H01L 24/37 |
| | | | | 219/121.84 |
| 2020/0075529 | A1 | 3/2020 | Otsuka et al. | |

FOREIGN PATENT DOCUMENTS

| DE | 102016122973 A1 | 6/2017 |
|---|---|---|
| JP | 2020092229 A | 6/2020 |

* cited by examiner

*Primary Examiner* — Hoa B Trinh
(74) *Attorney, Agent, or Firm* — Murphy, Bilak & Homiller, PLLC

(57) ABSTRACT

A method of forming a semiconductor device includes providing a carrier comprising a die attach pad, providing a semiconductor die that includes a bond pad disposed on a main surface of the semiconductor die, and providing a metal interconnect element, arranging the semiconductor die on the die attach pad such that the bond pad faces away from the die attach pad, and welding the metal interconnect element to the bond pad, wherein the bond pad comprises first and second metal layers, wherein the second metal layer is disposed between the first metal layer and a semiconductor body of the semiconductor die, wherein a thickness of the first metal layer is greater than a thickness of the second metal layer, and wherein the first metal layer has a different metal composition as the second metal layer.

20 Claims, 7 Drawing Sheets

HIGH DENSITY AND DURABLE SEMICONDUCTOR DEVICE INTERCONNECT

BACKGROUND

Electronics components such as semiconductor packages and power modules require electrical interconnections, such as between the bond pad of a semiconductor die and a package lead or board-level contact pad. These electrical interconnections may be effectuated by conductive bond wires. While advantageous in some respects, bond wires have limited current carrying capacity due to physical constraints such as maximum loop temperature. Moreover, bond wires have minimum bond feet pitch requirements, which restrict how densely multiple bond wires can be arranged in a given area. These constraints in combination with the restricted process-capability of common wire bonding equipment make bond wires ill-suited for certain applications including those requiring high power density. Alternatively, these electrical interconnections may be effectuated by metal interconnect clips. Metal interconnect clips have a greater current carrying capacity than bond wires. However, metal clips require a conductive adhesive such as solder or sinter to secure the clip to the bond pad and ensure a reliable electrical connection thereafter. However, applying the conductive adhesive creates additional challenges that increase cost and complexity of the electrical interconnect in comparison to wire bonding. In particular, maintaining an acceptable positioning tolerance of the conductive adhesive material within the bonding areas can be challenging and/or requires complex equipment. Moreover, the potential for bleeding of the conductive adhesive requires solder masks and/or marginal buffer regions around the bonding areas. Furthermore, the long term stability of the conductive adhesive represents often represents the gating factor in the useful life of the device.

SUMMARY

A method of forming a semiconductor assembly is disclosed. According to an embodiment, the method comprises providing a carrier comprising a die attach pad, providing a semiconductor die that comprises a bond pad disposed on a main surface of the semiconductor die, and providing a metal interconnect element, arranging the semiconductor die on the die attach pad such that the bond pad faces away from the die attach pad, and welding the metal interconnect element to the bond pad by applying thermal energy to the bond pad, wherein the bond pad comprises first and second metal layers, wherein the second metal layer is disposed between the first metal layer and a semiconductor body of the semiconductor die, wherein a thickness of the first metal layer is greater than a thickness of the second metal layer, and wherein the first metal layer has a different metal composition as the second metal layer.

Separately or in combination, the metal interconnect element comprises a first connection portion with a planar mating surface, wherein the first metal layer of the bond pad extends to an upper surface of the bond pad, and wherein welding the metal interconnect element to the bond pad comprises arranging the metal interconnect element on the bond pad such that the planar mating surface is flush against the upper surface of the bond pad, and applying localized energy to the first connection portion so as to form a welded joint between the first connection portion and the first metal layer. Separately or in combination, the first metal layer comprises a first bulk layer and a porous region, wherein the first bulk layer is disposed between the porous region and the second metal layer, and wherein the porous region extends to the upper surface of the bond pad.

Separately or in combination, the bond pad comprises a third metal layer, wherein the third metal layer has a different metal composition as the first metal layer, and wherein the third metal layer is vertically interposed in between the porous region.

Separately or in combination, the first metal layer is between 20 μm and 200 μm thick, and wherein the second metal layer is no greater than 1 μm thick.

Separately or in combination, the second metal layer is configured as a barrier layer that prevents diffusion of metal atoms from the first metal layer into the semiconductor body of the semiconductor die.

Separately or in combination, the first metal layer is a layer of copper, and wherein the second metal layer is layer of W, TiW, TaN, or TiN.

Separately or in combination, the thickness of the first metal layer is at least 10% of a thickness of the first connection portion.

Separately or in combination, the metal interconnect element further comprises a bridge portion that adjoins the first connection portion, and wherein a thickness of the bridge portion is greater than the thickness of the first connection portion.

Separately or in combination, an area of the welded joint is less than or equal to 1 square millimeter.

Separately or in combination, the carrier is configured as a power electronics substrate that comprises a first metallization layer disposed on an insulating substrate, and wherein the method further comprises electrically connecting the metal interconnect element to a structured region of the first metallization layer.

Separately or in combination, the carrier is configured as a metal lead frame that comprises a landing pad connected with one or more package leads, and wherein the method further comprises electrically connecting the metal interconnect element to the landing pad.

Separately or in combination, welding the metal interconnect element to the bond pad comprises laser welding or resistance welding.

A semiconductor assembly is disclosed. According to an embodiment, the semiconductor assembly comprises a carrier comprising a die attach pad, a semiconductor die that comprises a bond pad disposed on a main surface of the semiconductor die, and a metal interconnect element, wherein the bond pad comprises first and second metal layers, wherein the second metal layer is disposed between the first metal layer and a semiconductor body of the semiconductor die, wherein a thickness of the first metal layer is greater than a thickness of the second metal layer, wherein the first metal layer has a different metal composition as the second metal layer, and wherein the metal interconnect element is welded to the bond pad.

Separately or in combination, the metal interconnect element comprises a first connection portion with a planar mating surface, wherein the bond pad comprises a planar upper surface that is formed by the first metal layer, and wherein the metal interconnect element is welded to the bond pad by a welded joint formed between the first connection portion and the first metal layer.

Separately or in combination, an area of the welded joint is less than or equal to 1 square millimeter.

Separately or in combination, the first metal layer comprises a first bulk layer of a first metal and a porous region of the first metal, wherein the first bulk layer is disposed between the porous region and the second metal layer, and wherein the porous region of the first metal forms the planar upper surface.

Separately or in combination, the first metal layer is between 20 µm and 200 µm thick, and wherein the second metal layer is no greater than 1 µm thick.

Separately or in combination, the metal interconnect element further comprises a bridge portion that adjoins the first connection portion, wherein a thickness of the first connection portion is less than a thickness of the bridge portion.

Separately or in combination, the carrier further comprises a landing pad, wherein the metal interconnect element further comprises a second connection portion, wherein the bridge portion is arranged between the first and second connection portions, and wherein the metal interconnect element forms an electrical connection between the bond pad and the landing pad.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIG. 1A illustrates the semiconductor assembly from a cross-sectional perspective; and FIG. 1B illustrates the semiconductor assembly from a plan-view perspective.

FIG. 4, which includes FIG. 4A illustrates the semiconductor assembly from a cross-sectional perspective; and FIG. 4B illustrates the semiconductor assembly from a plan-view perspective.

DETAILED DESCRIPTION

Disclosed herein is a semiconductor assembly and a corresponding method of forming a semiconductor assembly by an electrical interconnect technique that advantageously provides a high current carrying capacity and advantageously avoids some of the drawbacks of other electrical interconnect techniques. According to the technique, a metal interconnect element, such as a metal clip or bond wire, is welded to the bond pad of a semiconductor die. The welding technique advantageously avoids the drawbacks of other techniques that utilize an intermediary material, such as soldering or sintering, because no solder masks and/or marginal buffer regions around the bonding areas are required. Thus, a higher density of electrical interconnections is possible. Moreover, the welded joints formed by this technique have greater long term stability than a solder or sinter connection. One challenge associated with welding an electrical interconnect element directly to a semiconductor die is that a substantial amount of energy is required to form the welded joint, which in turn creates temperatures in the vicinity of the welded material that may be damaging to the semiconductor die. These challenges are addressed though advantageous configurations of the joining partners described herein. In particular, the metal interconnect element may comprise a locally thinned end connection portion that is used to effectuate the weld to the semiconductor die. This reduces the amount of energy required to create the weld while simultaneously maintaining high current carrying capability outside of the end connection portion. Additionally, the bond pad of the semiconductor die has a multi-layer configuration that is designed to accommodate the welded joint and temperatures around the welded joint while protecting the semiconductor die. In particular, the bond pad may comprise a relatively thick upper metal layer of porous metal, e.g., porous copper, and a relatively thin lower metal layer which comprises a different metal composition as the upper metal layer. The upper metal layer absorbs most of the energy associated with the welding process and thus protects the semiconductor die from damaging temperatures during the welding process. The lower metal layer is configured as a barrier layer that prevents diffusion of atoms from the upper metal layer into the semiconductor die during the welding process or during application.

Figure 1A:
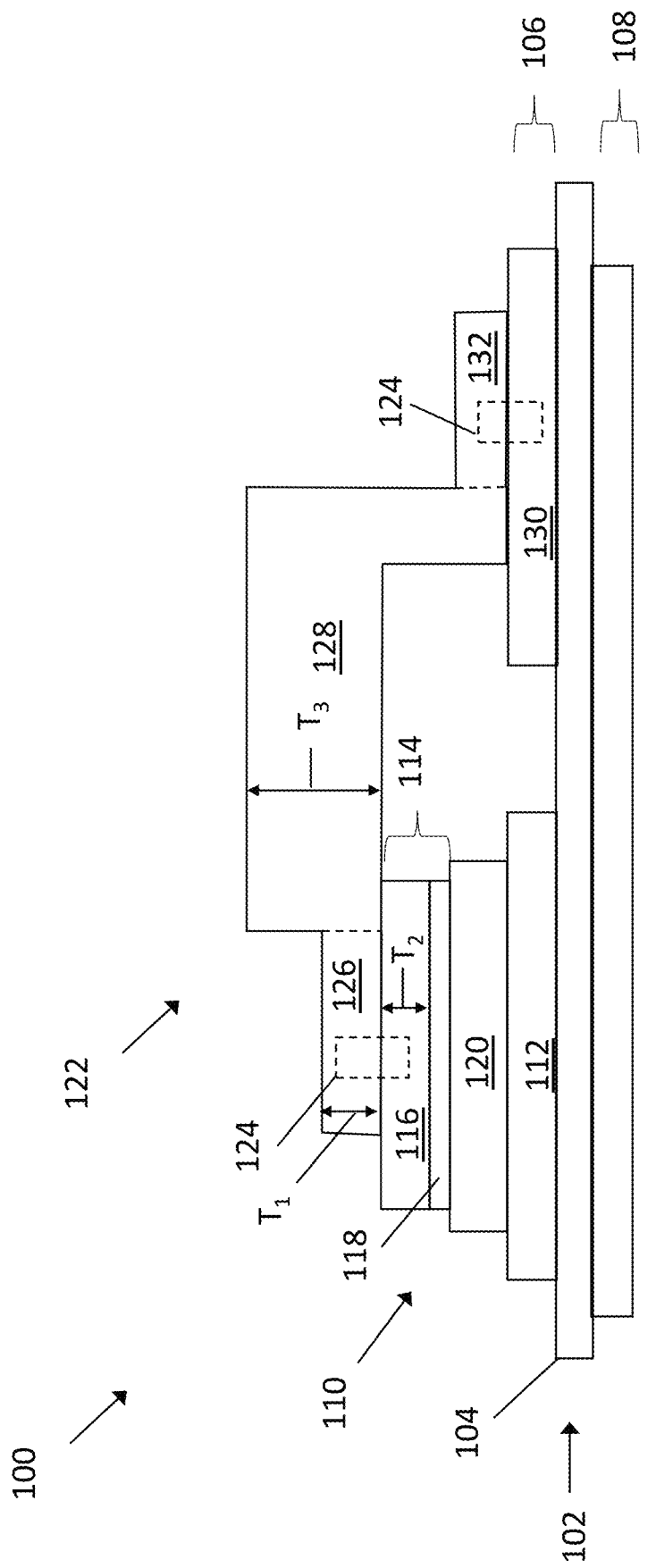
FIGS. 1A and 1B, illustrates a semiconductor assembly with a metal interconnect element welded to a semiconductor die, according to an embodiment.
Figure 1B:
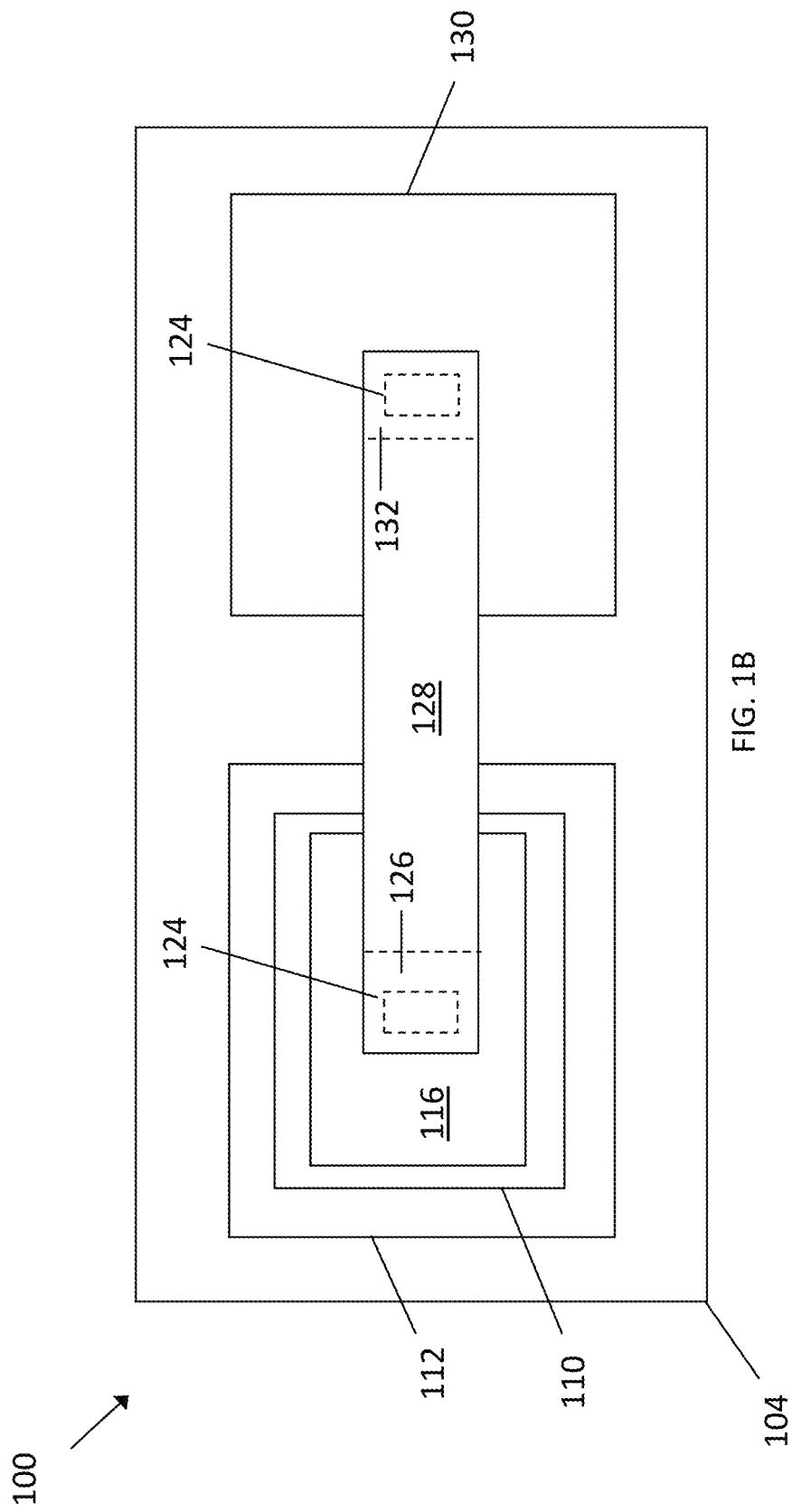

Referring to FIG. 1, a semiconductor assembly 100 comprises a carrier structure 102. The carrier structure 102 is an electronics carrier that is configured to accommodate the one or more electronics elements thereon. The carrier structure 102 comprises electrically conductive regions and may optionally comprise an electrically insulating substrate region. Examples of these carrier structures 102 include power electronics substrates such as isolated metal substrates (IMS), direct copper bonding (DCB) substrates, or active metal brazed (AMB) substrates, for example. These power electronics substrates may form the bottom part of a power module that comprises multiple power electronics component mounted thereon. A power electronics substrate may comprise an electrically insulating substrate 104 that comprises a dielectric material such as ceramic, silicon dioxide, aluminum oxide, aluminum nitride, zirconium oxide, silicon nitride, boron nitride, epoxy resin, polyimide, etc. A power electronics substrate may comprise a first metallization layer 106 that is bonded to the electrically insulating substrate. The first metallization layer 106 can be structured into bond pads, die attach pads, and conductive interconnect tracks. The first metallization layer 106 can comprise or be plated with Cu, Ni, Ag, Au, Pd, Pt, NiV, NiP, NiNiP, NiP/Pd, Ni/Au, NiP/Pd/Au, or NiP/Pd/AuAg, for example. A power electronics substrate may additionally comprise a second (lower) metallization layer 108 formed of similar or identical metals as the first metallization layer 106 that is configured to be mated with an external heat sink structure, for example. Instead of a power electronics substrate, the carrier structure 102 can be configured as a printed circuit board (PCB), for example. A PCB may comprise an electrically insulating substrate of pre-peg material such as FR-4, CEM-1, G-10, etc. and a first metallization layer 106 formed of similar or identical metals as described above. The first metallization layer 106 can be structured into bond pads, die attach pads, and conductive interconnect tracks. In yet another example, the carrier structure 102 can be a metal lead frame structure that does not comprise an electrically insulating substrate, an example of which will be discussed in further detail below with respect to FIGS. 4-5.

The semiconductor assembly 100 further comprises a semiconductor die 110. The semiconductor die 110 is mounted on a die attach pad 112 of the carrier structure 102. The die attach pad 112 may correspond to a structured portion of the first metallization layer 106 in the case of a power electronics substrate or PCB. The semiconductor die 110 can be mounted on the die attach pad 112 by a conductive adhesive such as solder, sinter, etc. In the case of a vertical device, the semiconductor die 110 may comprise a lower surface bond pad that is electrically connected to the die attach pad 112. Alternatively in the case of a lateral device, the mounting of the semiconductor die 110 may be a purely mechanical connection.

Generally speaking, the semiconductor die 110 can have a wide variety of device configurations. For example, the semiconductor die 110 can be configured as a discrete device, e.g., a MOSFET (Metal Oxide Semiconductor Field Effect Transistor), an IGBT (Insulated Gate Bipolar Transistor), an HEMT (High Electron Mobility Transistor), diode, etc. Alternatively, the semiconductor die 110 can be configured as an integrated device, e.g., a driver die, controller die, etc. The semiconductor die 110 can comprise type IV semiconductor materials, e.g., silicon, silicon germanium, silicon carbide, etc., and/or type III-V semiconductor materials, e.g., gallium nitride, gallium arsenide, etc. The semiconductor die 110 can be configured as a vertical device, which refers to a device that is configured to control a current flowing between a main (upper) surface of the die and a rear (lower) surface of the die. Alternatively, the semiconductor die 110 can be configured as a lateral device, which refers to a device that is configured to control a current flowing parallel to a main (upper) surface of the die.

According to an embodiment, the semiconductor die 110 is configured as a discrete power device that rated to accommodate voltages of at least 100 V (volts) as between two load terminals and may be 600 V, 1200V or more and/or is rated to accommodate currents of at least 1 A (amperes) and may be 10 A, 50 A, 100 A or more as between two load terminals. Examples of discrete power devices include discrete transistor devices such as MOSFETs, HEMTs, IGBTs, etc., and discrete diodes.

The semiconductor die 110 comprises a bond pad 114 that is disposed on a main surface of the semiconductor die 110 and faces away from the carrier structure 102. The bond pad 114 is an externally accessible point of electrical contact to a terminal of the semiconductor die 110, e.g., gate, source, drain, etc. In an embodiment wherein the semiconductor die 110 is configured as a discrete power device, the bond pad 114 may correspond to load terminal of the device, e.g., source or drain terminal in the case of a MOSFET, collector or emitter in the case of an IGBT, anode or cathode in the case of a diode, and so forth.

The bond pad 114 comprises a first metal layer 116 and a second metal layer 118. The first and second metal layers 116, 118 have a different material composition from one another and may have different thicknesses, the details of which will be described in further detail below. The second metal layer 118 is disposed between the first metal layer 116 and a semiconductor body 120 of the semiconductor die 110. At least a portion of the second metal layer 118 may contact the semiconductor body 120 directly and form a low-ohmic connection with a device region of the semiconductor body 120. Optionally, at least some of the second metal layer 118 may be disposed on an electrically insulating layer (not shown), such a layer of silicon dioxide, silicon nitride, silicon oxynitride, etc. The first metal layer 116 extends to an upper surface of the bond pad 114 and thus forms an outer contact surface of the bond pad 114 to which an external electrical connection can be effectuated.

The semiconductor assembly 100 further comprises a metal interconnect element 122. The metal interconnect element 122 is an electrically conductive structure that is configured to provide a low-resistance electrical connection between two electronics components, such as between a semiconductor die and a bond pad of a circuit carrier or landing pad of a metal lead frame structure. According to an embodiment, the metal interconnect element 122 is configured as a metal clip. This metal clip can be a rigid structure that is provided from a piece of sheet metal and is structured to have the geometric properties depicted and described herein by standard lead frame processing techniques, e.g., punching, etching, stamping, etc. This metal clip can comprise or be plated with Cu, Ni, Ag, Au, Pd, Pt, NiV, NiP, NiNiP, NiP/Pd, Ni/Au, NiP/Pd/Au, or NiP/Pd/AuAg, for example. According to an embodiment, the metal clip comprises a core portion of low-resistance metal that represents a substantial majority of the cross-sectional area of the metal clip and an outer coating that protects the core portion and/or enhances adhesion to the metal clip. The core portion can be a region of copper or at least substantially pure copper, i.e., copper with at least 95% copper purity and more preferably at least 99% purity with a maximum thickness of between 0.2 mm and 2.0 mm. The outer coating can be a layer of anti-corrosive metal such as Ni or Ni alloy with a maximum thickness of between 0.5 μm and 50 μm.

The metal interconnect element 122 is welded to the bond pad 114. Welding refers to a technique whereby two metallic joining partners are heated to raise the temperature of the constituent metals above their melting point such that portions of the joining partners liquefy and react with one another. As the melted metal from the joining partners cools, it fuses together to create a welded joint 124 between the joining partners. The welded joint 124 forms a strong mechanical bond between the two joining partners and results in a low-ohmic conduction path between the two joining partners. Soldering and sintering techniques differ from welding in that these techniques are performed using an intermediary material between the two joining partners, and are performed at temperatures lower than the melting point of the two joining partners. A welding technique does not require any intermediary material between the two joining partners such that the material of the two joining partners may be directly fused with one another.

The metal interconnect element 122 can be welded to the bond pad 114 according to the following technique. Initially, the metal interconnect element 122 is placed over the bond pad 114 such that the two elements contact one another. The metal interconnect element 122 may comprise a first connection portion 126 that is disposed at an end of the metal interconnect and is used to effectuate the weld. The first connection portion 126 may comprise a planar mating surface that is arranged to be flush against the upper surface of the bond pad 114. The planar mating surface can be arranged to be in direct contact with the upper surface of the bond pad 114. Subsequently, localized energy, e.g., in the form of heat, radiation, etc. may be applied to the first connection portion 126, thereby elevating the temperature of the metal interconnect element 122 in the first connection portion 126 and in the subjacent material of the bond pad 114. This energy is applied so as to elevate the temperature of the metal interconnect element 122 in the first connection portion 126 and the first metal layer 116 of the bond pad 114 above the respective melting points of the constituent metals from both joining partners.

According to one embodiment, the metal interconnect element 122 is welded to the bond pad 114 by a resistance welding technique. In this technique, a very high current is passed through the metal interconnect element 122 so as to create heat through resistive heating. According to another embodiment, the metal interconnect element 122 is welded to the bond pad 114 by a laser welding technique. In this technique, a laser apparatus is arranged over the metal interconnect element 122 and concentrated radiation, e.g., from a continuous or pulsed laser beam, is directed at the at the upper surface of the metal interconnect element 122 so as to create sufficient heat to effectuate the weld. More generally, the metal interconnect element 122 can be welded to the bond pad 114 according to any known welding technique that utilizes thermal energy to fuse the material together.

The bond pad 114 is advantageously configured to form a welded joint 124 with the metal interconnect element 122 while protecting the semiconductor body 120 of the semiconductor die 110 from the welding process. In particular, the first metal layer 116 is sufficiently thick to ensure that the heat affected zone in the vicinity of the welded joint 124, which may reach temperatures in excess of 300° C., does not reach the semiconductor body 120 of the semiconductor die 110 and consequently does not damage or degrade performance of the semiconductor die 110. Generally speaking, the first metal layer 116 can have a thickness of at least 10 µm and more preferably at least 20 µm to meet these requirements. Meanwhile, the second metal layer 118 has a thickness and material composition that blocks or substantially mitigates diffusion of metal atoms from the first metal layer 116 semiconductor body 120. For example, in the case of a first metal layer 116 that comprises pure or substantially pure copper, the second metal layer 118 may be a layer of TiW or TiW that is between approximately 0.1 µm and 2.0 µm thick. More generally, the second metal layer 118 can comprise any diffusion barrier metal such as nickel, chromium, tantalum, cobalt, etc., and alloys thereof, and the thickness of the second metal layer 118 may be selected to balance a trade-off between electrical resistivity and diffusion barrier performance.

The thickness of the metal interconnect element 122 and the thickness of the first metal layer 116 can be correlated to one another so as to ensure that the heat affected zone of the welded joint 124 does not reach the semiconductor body 120 of the semiconductor die 110. As a general rule, the depth of the welded joint 124 formed in the bond pad 114 is dependent on the thickness of the portion of the metal interconnect element 122 that is welded to the bond pad 114. That is, thicker joining partners require more energy to melt the material. Induced welding depths (or range of critical temperatures) within the lower joining partner are typically at least approximately 10% of the thickness of the upper joining part. Thus, by correlating the thicknesses of the metal interconnect element 122 and the first metal layer 116 such that the first metal layer 116 is at least 10% as thick as the first connection portion 126, the heat affected zone in the vicinity of the welded joint 124 does not reach the semiconductor body 120, and thus does not damage the device. Using numerical values as an example, the first connection portion 126 can have a thickness $T_1$ in the range of 0.1 mm and 1.0 mm thick, and the first metal layer 116 can have a thickness $T_2$ in the range of 10 µm and 100 µm thick, wherein the thickness $T_2$ of the first metal layer 116 is at least 10% of the thickness $T_1$ of the first connection portion 126. In some laser welding techniques, the induced depths may be approximately 30% of the thickness of the upper joining part. Thus, the thicknesses of the first metal layer 116 can be at least 30% as thick as the first connection portion 126, e.g., in the case that a laser welding technique is used.

The welded joints 124 formed by the welding process are advantageously space efficient in comparison to joints formed by other techniques such as soldering or sintering. The area of the welded joint 124 itself can advantageously be made very small, e.g., smaller than 1 mm², while offering superior mechanical strength and long term durability in comparison to a comparably sized solder or sinter joint. More generally, the area of the welded joint 124 can be in the range 0.0001 mm²-100 mm². An additional advantage of the welding process is that there is no need for solder masks and/or buffer spaces around the semiconductor die 110, as there is no bleeding of intermediary material by the connection process.

As shown, the metal interconnect element 122 can be configured to have a reduced thickness $T_1$ in the first connection portion 126 that forms the welded joint 124 relative to the thickness $T_3$ of the metal interconnect element 122 in a bridge portion 128 of the metal interconnect element 122 that adjoins the first connection portion 126. The bridge portion 128 of the metal interconnect element 122 can represent a substantial majority of the length of the metal interconnect element 122, e.g., greater than 70% of the length, greater than 80% of the length, greater than 90% of the length, etc. According to one embodiment, the thickness $T_3$ of the metal interconnect element 122 in the bridge portion 128 is at least twice the thickness $T_1$ of the metal interconnect element 122 in the first connection portion 126. According to another embodiment, the thickness $T_3$ of the metal interconnect element 122 in the bridge portion 128 is at least three times the thickness $T_1$ of the metal interconnect element 122 in the first connection portion 126. In numerical terms, the thickness $T_1$ of the metal interconnect element 122 in the first connection portion 126 can be in the range of 0.1 mm and 1.0 mm thick, whereas the thickness $T_3$ of the metal interconnect element 122 in the bridge portion 128 can be in the range of 1.0 µm-3.0 µm thick. By having a relatively higher thickness in the bridge portion 128, the cross-sectional area of the metal interconnect element 122 is increased and hence the resistivity and current carrying capability of the metal interconnect element 122 is improved. By having a relatively lower thickness in the first connection portion 126, the welding depths (or range of critical temperatures) within the first bond pad 114 can remain sufficiently low such that the thickness of the first metal layer 116 remains at values that are practically achievable and/or cost effective.

The metal interconnect element 122 can be electrically connected to a structured portion 130 of the first metallization layer 106 of the carrier structure 102 that is spaced apart from the die attach pad 112, thereby forming a low resistance electrical connection between the bond pad 114 and the structured portion 130 of the first metallization layer 106. The metal interconnect element 122 can comprise a second connection portion 132 that adjoins the bridge portion 128 and is disposed on an opposite end of the metal interconnect element 122 as the first connection portion 126. This second connection portion 132 can have a similar or identical thickness as the first connection portion 126, and may be welded to the structured portion 130 of the first metallization layer 106 of the carrier structure 102 using the same technique used to weld the first connection portion 126. This is not necessary, however. In other embodiments, the thickness of the second connection portion 132 can be greater than the thickness of the first connection portion 126, and/or may be same as the bridge portion 128. Moreover, the second connection portion 124 can be attached to the structured portion 130 of the first metallization layer 106 by other techniques such as soldering or sintering.

Figure 2:
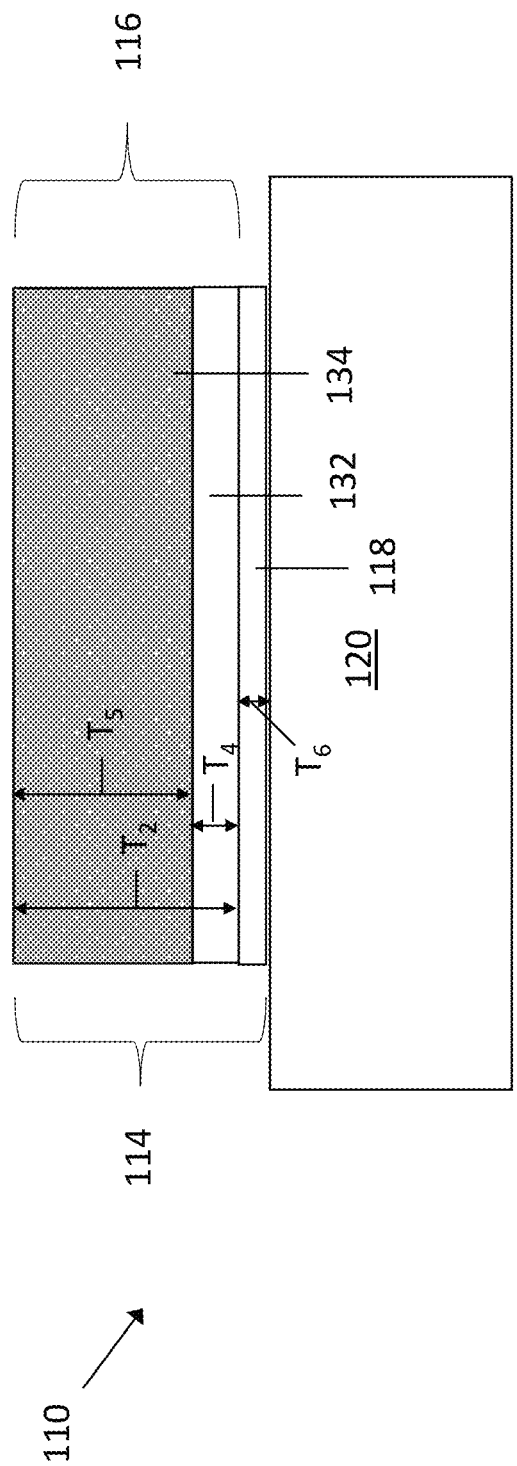
FIG. 2, illustrates a close-up view of a bond pad configuration of a semiconductor die from a cross-sectional perspective, according to an embodiment.

Referring to FIG. 2, a close-up view of the structure of the bond pad 114 is shown, according to an embodiment. The first metal layer 116 of the bond pad 114 can comprise a first bulk layer 132 and a porous region 134. The first bulk layer 132 can be a substantially pore-free layer of metal which can be formed by a sputtering or a plating technique, for example. A thickness $T_4$ of the first bulk layer 132 can be no greater than 25 µm, for example. The porous region 134 extends to the upper surface of the bond pad 114 and thus forms the welding surface of the bond pad 114. A thickness $T_5$ of the porous region 134 can be in the range of 10 µm and 175 µm, for example. Separately or in combination, the overall thickness $T_2$ of the first metal layer 116 can be in the range of 10 µm and 200 µm, with thickness $T_4$ of the first bulk layer 132 accounting for no greater than 10 percent of the overall thickness $T_2$ of the first metal layer 116. The first bulk layer 132 and the porous region 134 may each comprise the same metal. For example, the first bulk layer 132 and the porous region 134 may each comprise copper or at least substantially pure copper, i.e., copper with at least 95% copper purity and more preferably at least 99% purity. Alternatively, the first bulk layer 132 and/or the porous region 134 can comprise other metals that are conducive to pore-formation, such as silver.

The first metal layer 116 comprising the porous region 134 can be formed according to the techniques described in U.S. patent application Ser. No. 14/953,456 filed Nov. 30, 2015 and issued as U.S. Pat. No. 9,620,466 on Apr. 17, 2017, the content of which is incorporated by reference herein in its entirety. To summarize this process, the porous region 134 may be produced by printing or spray coating processes. For simplification of structuring processes, the porous region 134 may only be locally printed in the area of the bond pad 114. Since high layer density is not required, densification processes, which add cost and complexity, can be omitted or reduced. A porosity of the porous region 134 can be in the range from about 10% to about 90%. The presence of pores allows for the first metal layer 116 to be made advantageously thick in comparison to metallization layers that are formed by standard metallization techniques. This is because the pores substantially alleviate the stress mismatch between the first metal layer 116 and the semiconductor body 120 that arises with large temperature changes due to differences in CTE (coefficient of thermal expansion) of the material from the two regions.

Figure 3:
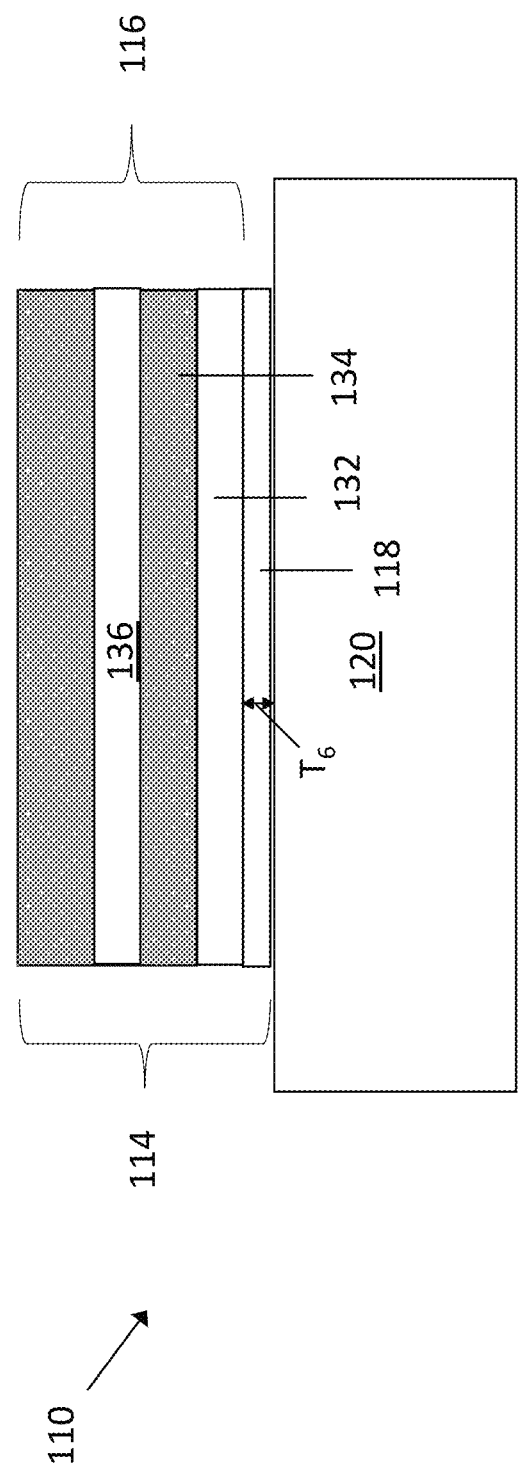
FIG. 3, illustrates a close-up view of a bond pad configuration of a semiconductor die from a cross-sectional perspective, according to an embodiment.

Referring to FIG. 3, a close-up view of the structure of the bond pad 114 is shown, according to an embodiment. The bond pad 114 structure of FIG. 3 resembles that of FIG. 2, except that the bond pad 114 comprises a third metal layer 136. The third metal layer 136 can have a different metal composition as the first metal layer 116. The third metal layer 136 can have the same material composition as the second metal layer 118, and may have the same or similar thickness as the second metal layer 118. For example, the third metal layer 136 may be a layer of TiW or TiW that is between approximately 0.1 µm and 2.0 µm thick. The third metal layer 136 is vertically interposed in between the porous region 134. That is, a portion of the porous region 134 is disposed below the third metal layer 136 and a portion of the portion of the porous region 134 is disposed above the porous region 134. The third metal layer 136 can be configured as an additional barrier layer that prevents diffusion of metal atoms from the first metal layer 116 from diffusing into the semiconductor body 120 of the semiconductor die 110 during the welding process or during application in a similar manner as previously described.

Figure 4A:
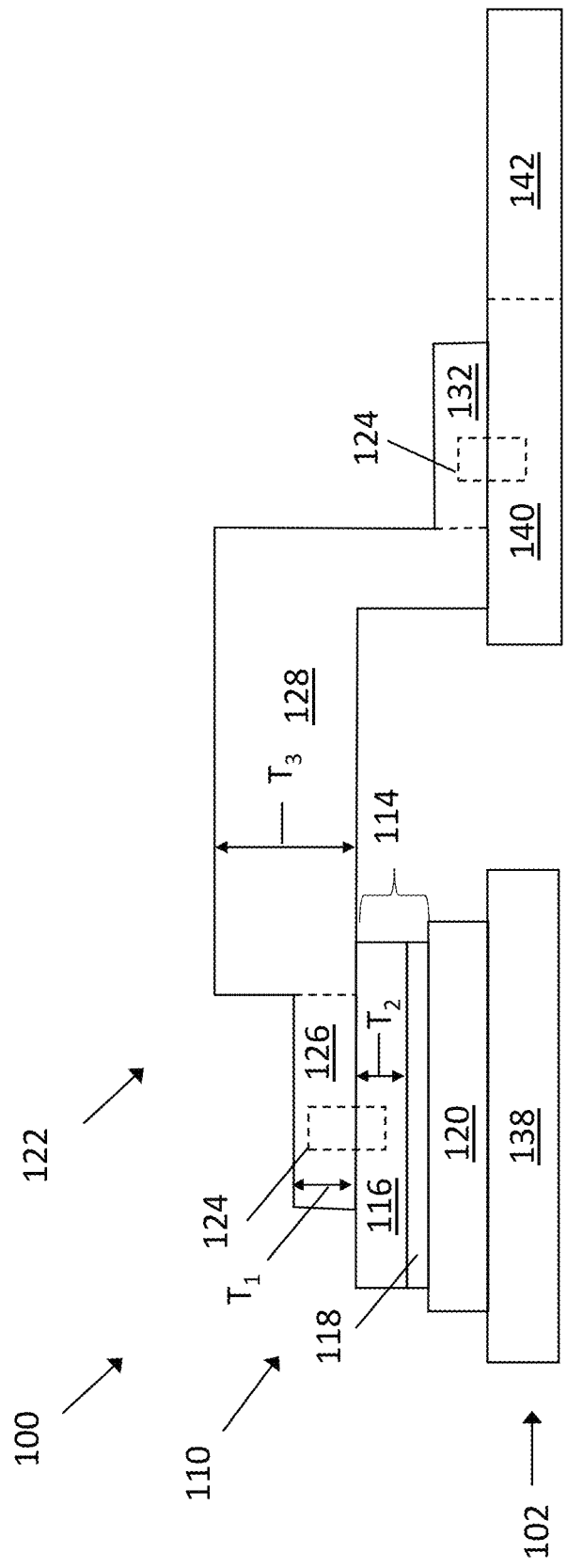
FIGS. 4A and 4B, illustrates a semiconductor assembly with a metal interconnect element welded to a semiconductor die, according to another embodiment.
Figure 4B:
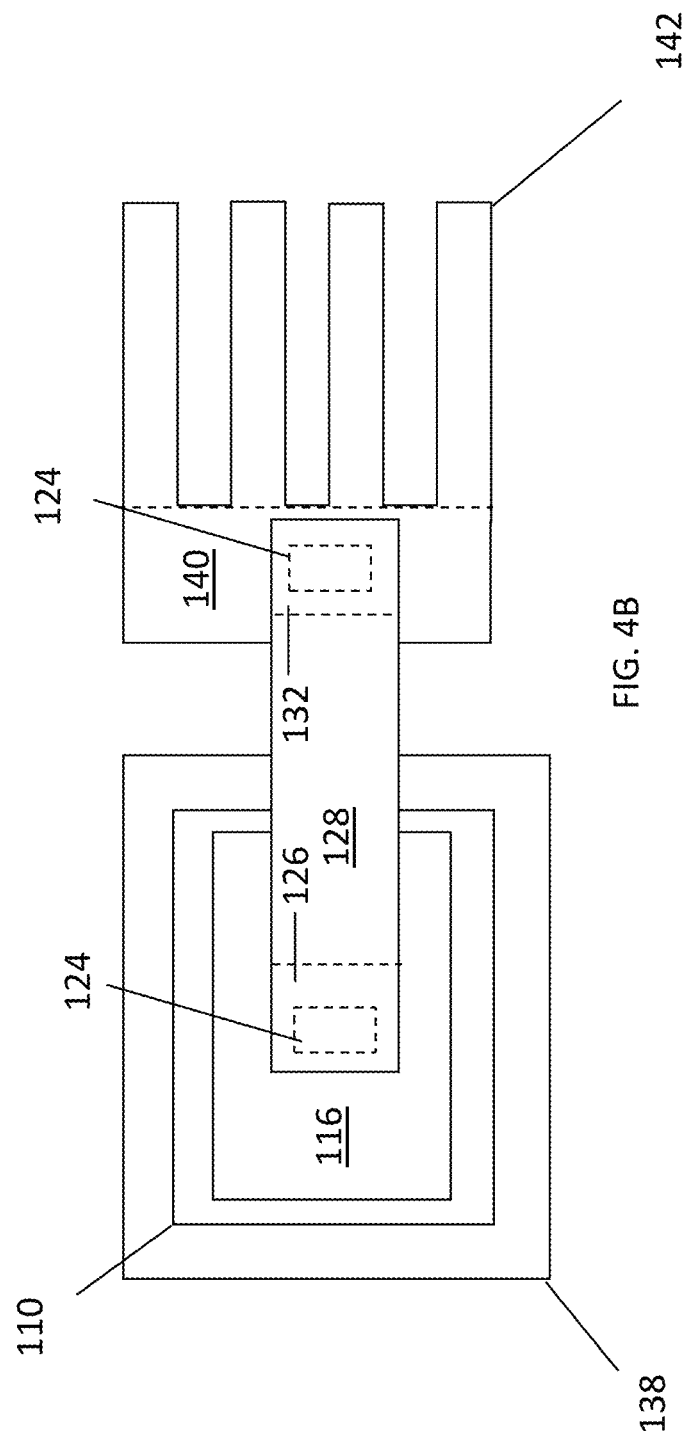

Referring to FIG. 4, a semiconductor assembly 100 is depicted, according to another embodiment. In this embodiment, the semiconductor assembly 100 is configured as a discrete packaged semiconductor device instead of a power module, as was the case in FIG. 1. To this end, the carrier structure 102 is a metal lead frame that comprises a die pad 138 and a landing pad 140 spaced apart from the die pad 138 and connected with multiple package leads 142. A metal lead frame of this sort can be provided from a relatively uniform thickness piece of conductive metal with a generally planar upper and lower surfaces, and the features of the lead frame are formed by metal processing techniques such as etching, stamping, punching, coining, etc. The metal interconnect element 122 is welded to the bond pad 114 of the semiconductor die 110 in a similar manner as previously described and is electrically connected to the landing pad 140, e.g., by welding, soldering, sintering, etc., thus providing an electrical connection between the two. An encapsulant body of electrically insulating material (not shown) can be formed on the lead frame so as to encapsulate the semiconductor die 110, the metal interconnect element 122 and portions of the leads 142, thereby forming a packaged semiconductor device. The packaged semiconductor device can have a variety of different lead configurations, e.g., flat, bent, surface mount, etc., and the illustrated embodiment illustrates just one example. Moreover, the metal interconnect technique can be used to form one or more connections with any one or more groups of leads.

Figure 5:
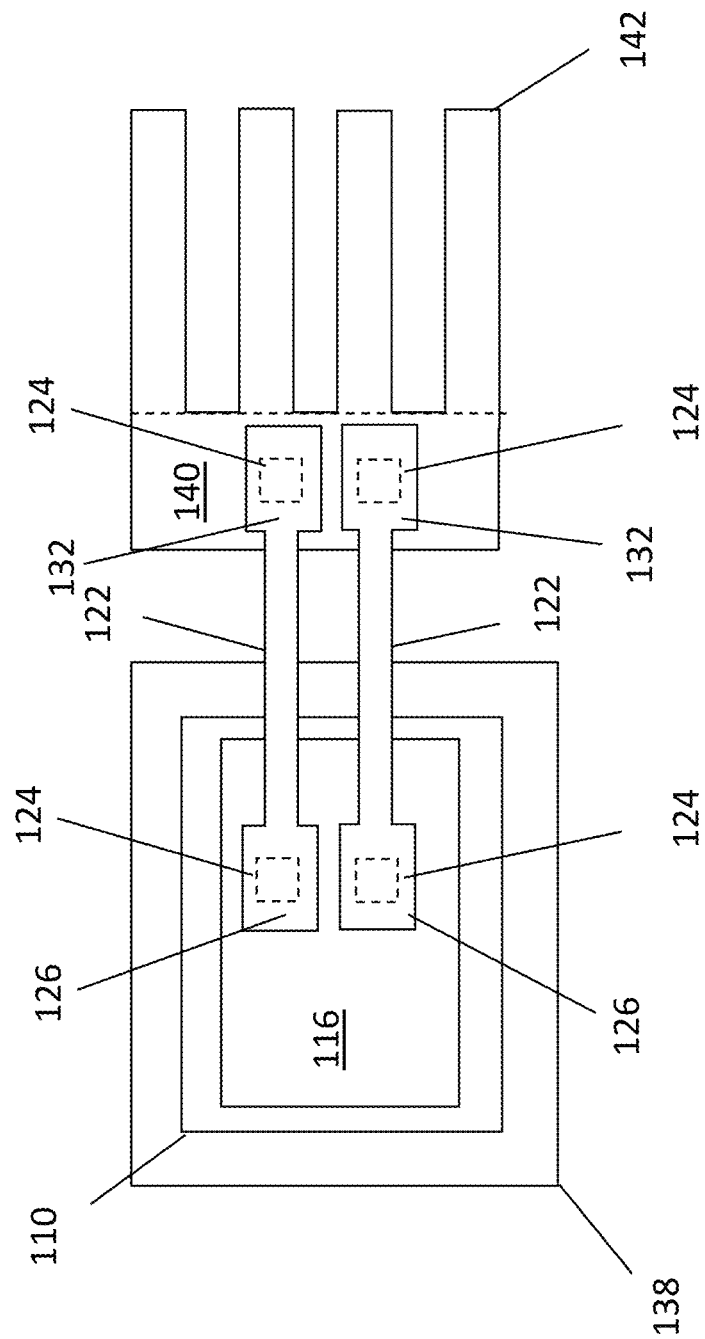
FIG. 5 illustrates a semiconductor assembly from a plan-view perspective with a metal interconnect element welded to a semiconductor die, according to another embodiment.

Referring to FIG. 5, a semiconductor assembly 100 is depicted, according to another embodiment. In this embodiment, the semiconductor assembly 100 comprises two of the metal interconnect elements 122 connected in parallel with one another, wherein the metal interconnect elements 122 are configured as conductive metal bond wires. These bond wires comprise first connection portions 126 that are relatively flat so as to enable surface contact and have thickness values that are adapted for welding to the bond pad 114, e.g., on the order of 10 µm to 50 µm. These first connection portions 126 can be welded to the bond pad 114 in a similar manner as previously described. The bond wires may additionally comprise second connection portions 132 that can be electrically connected to the landing pad, e.g., by welding, soldering, sintering, etc. Outside of the first and second connection portions 126, 132, the bond wires can have a generally circular cross-sectional geometry. In yet another embodiment (not shown), the metal interconnect elements 122 can be configured as conductive metal ribbons that comprise first connection portions 126 having the properties described herein, and are welded to the bond pad 114 in a similar manner as described herein.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a semiconductor assembly, the method comprising:
providing a carrier comprising a die attach pad;
providing a semiconductor die that comprises a bond pad disposed on a main surface of the semiconductor die; and
providing a metal interconnect element;
arranging the semiconductor die on the die attach pad such that the bond pad faces away from the die attach pad; and
welding the metal interconnect element to the bond pad by applying thermal energy to the bond pad;
wherein the bond pad comprises first and second metal layers,
wherein the second metal layer is disposed between the first metal layer and a semiconductor body of the semiconductor die,
wherein a thickness of the first metal layer is greater than a thickness of the second metal layer, and
wherein the first metal layer has a different metal composition as the second metal layer.

2. The method of claim 1, wherein the metal interconnect element comprises a first connection portion with a planar mating surface, wherein the first metal layer of the bond pad extends to an upper surface of the bond pad, and wherein welding the metal interconnect element to the bond pad comprises:
arranging the metal interconnect element on the bond pad such that the planar mating surface is flush against the upper surface of the bond pad; and
applying localized energy to the first connection portion so as to form a welded joint between the first connection portion and the first metal layer.

3. The method of claim 2, wherein the first metal layer comprises a first bulk layer and a porous region, wherein the first bulk layer is disposed between the porous region and the second metal layer, and wherein the porous region extends to the upper surface of the bond pad.

4. The method of claim 3, wherein the bond pad comprises a third metal layer, wherein the third metal layer has a different metal composition as the first metal layer, and wherein the third metal layer is vertically interposed in between the porous region.

5. The method of claim 2, wherein the first metal layer is between 20 μm and 200 μm thick, and wherein the second metal layer is no greater than 1 μm thick.

6. The method of claim 2, wherein the second metal layer is configured as a barrier layer that prevents diffusion of metal atoms from the first metal layer into the semiconductor body of the semiconductor die.

7. The method of claim 2, wherein the first metal layer is a layer of copper, and wherein the second metal layer is layer of W or TiW, TaN, or TiN.

8. The method of claim 2, wherein the thickness of the first metal layer is at least 10% of a thickness of the first connection portion.

9. The method of claim 8, wherein the metal interconnect element further comprises a bridge portion that adjoins the first connection portion, and wherein a thickness of the bridge portion is greater than the thickness of the first connection portion.

10. The method of claim 2, wherein an area of the welded joint is less than or equal to 1 square millimeter.

11. The method of claim 1, wherein the carrier is configured as a power electronics substrate that comprises a first metallization layer disposed on an insulating substrate, and wherein the method further comprises electrically connecting the metal interconnect element to a structured region of the first metallization layer.

12. The method of claim 1, wherein the carrier is configured as a metal lead frame that comprises a landing pad connected with one or more package leads, and wherein the method further comprises electrically connecting the metal interconnect element to the landing pad.

13. The method of claim 1 wherein welding the metal interconnect element to the bond pad comprises laser welding or resistance welding.

14. A semiconductor assembly, comprising:
a carrier comprising a die attach pad;
a semiconductor die that comprises a bond pad disposed on a main surface of the semiconductor die; and
a metal interconnect element;
wherein the bond pad comprises first and second metal layers,
wherein the second metal layer is disposed between the first metal layer and a semiconductor body of the semiconductor die,
wherein a thickness of the first metal layer is greater than a thickness of the second metal layer,
wherein the first metal layer has a different metal composition as the second metal layer, and
wherein the metal interconnect element is welded to the bond pad.

15. The semiconductor assembly of claim 14, wherein the metal interconnect element comprises a first connection portion with a planar mating surface, wherein the bond pad comprises a planar upper surface that is formed by the first metal layer, and wherein the metal interconnect element is welded to the bond pad by a welded joint formed between the first connection portion and the first metal layer.

16. The semiconductor assembly of claim 15, wherein an area of the welded joint is less than or equal to 1 square millimeter.

17. The semiconductor assembly of claim 14, wherein the first metal layer comprises a first bulk layer of a first metal and a porous region of the first metal, wherein the first bulk layer is disposed between the porous region and the second metal layer, and wherein the porous region of the first metal forms the planar upper surface.

18. The semiconductor assembly of claim 14, wherein the first metal layer is between 20 μm thick and 200 μm thick, and wherein the second metal layer is no greater than 1 μm thick.

19. The semiconductor assembly of claim 14, wherein the metal interconnect element further comprises a bridge portion that adjoins the first connection portion, wherein a thickness of the first connection portion is less than a thickness of the bridge portion.

20. The semiconductor assembly of claim 18, wherein the carrier further comprises a landing pad, wherein the metal interconnect element further comprises a second connection portion, wherein the bridge portion is arranged between the first and second connection portions, and wherein the metal interconnect element forms an electrical connection between the bond pad and the landing pad.

\* \* \* \* \*